United States Patent
Chen et al.

(10) Patent No.: US 11,694,918 B2
(45) Date of Patent: Jul. 4, 2023

(54) METHOD AND DEVICE FOR WAFER TAPING

(71) Applicant: Yangtze Memory Technologies Co., Ltd., Wuhan (CN)

(72) Inventors: Peng Chen, Wuhan (CN); MingLiang Li, Wuhan (CN); Jian Miao, Wuhan (CN)

(73) Assignee: Yangtze Memory Technologies Co., Ltd., Wuhan (CN)

(*) Notice: Subject to any disclaimer, the term of this patent is extended or adjusted under 35 U.S.C. 154(b) by 30 days.

(21) Appl. No.: 17/481,337

(22) Filed: Sep. 22, 2021

(65) Prior Publication Data

US 2022/0005724 A1  Jan. 6, 2022

Related U.S. Application Data

(60) Division of application No. 16/538,834, filed on Aug. 13, 2019, now Pat. No. 11,232,969, which is a continuation of application No. PCT/CN2019/076113, filed on Feb. 26, 2019.

(51) Int. Cl.
*H01L 21/683* (2006.01)

(52) U.S. Cl.
CPC ...... *H01L 21/6836* (2013.01); *H01L 21/6831* (2013.01); *H01L 21/6838* (2013.01); *H01L 2221/68327* (2013.01)

(58) Field of Classification Search
CPC ........... H01L 21/67132; H01L 21/6836; H01L 21/6831; H01L 2221/68327
See application file for complete search history.

(56) References Cited

U.S. PATENT DOCUMENTS

| | | | |
|---|---|---|---|
| 6,007,654 | A | 12/1999 | McKenna |
| 10,312,099 | B2 | 6/2019 | Sekiya |
| 2005/0022930 | A1 | 2/2005 | Moriguchi |
| 2011/0232820 | A1 | 9/2011 | Yamamoto |

FOREIGN PATENT DOCUMENTS

| | | |
|---|---|---|
| CN | 101118843 A | 2/2008 |
| CN | 102201327 A | 9/2011 |
| CN | 103168352 A | 6/2013 |
| CN | 104081515 A | 10/2014 |
| CN | 105074890 A | 11/2015 |
| CN | 105283941 A | 1/2016 |
| CN | 105590891 A | 5/2016 |
| CN | 108789025 A | 11/2018 |
| CN | 108807220 A | 11/2018 |
| EP | 1458014 A1 | 9/2004 |
| JP | 2001-63908 | 3/2001 |
| JP | 2007027315 A | 2/2007 |
| JP | 2012033970 A | 2/2012 |
| JP | 2012049318 A | 3/2012 |
| JP | 2013016571 A | 1/2013 |
| JP | 5241904 B2 | 7/2013 |
| TW | M504009 U | 7/2015 |
| TW | 201827234 A | 8/2018 |
| WO | 2014/201627 A1 | 12/2014 |

*Primary Examiner* — Michael A Tolin
*Assistant Examiner* — Christopher C Caillouet
(74) *Attorney, Agent, or Firm* — Winston Hsu

(57) ABSTRACT

A method for taping a wafer is disclosed. A wafer taping device comprising a wafer stage is provided. A wafer is mounted and secured on the wafer stage. A tape is delivered along a first direction over the wafer. The tape is forced into adhesion with a surface of the wafer in a non-contact manner. The tape is cut along a perimeter of the wafer.

15 Claims, 5 Drawing Sheets

METHOD AND DEVICE FOR WAFER TAPING

CROSS REFERENCE TO RELATED APPLICATIONS

This application is a division of U.S. application Ser. No. 16/538,834 filed Aug. 13, 2019, which is a continuation of PCT application Ser. No. PCT/CN2019/076113, filed Feb. 26, 2019, designating the United States. The above-mentioned applications are included in its entirety herein by reference.

BACKGROUND

The present disclosure relates generally to the field of semiconductor wafer processing and, more particularly, to a method and a device for wafer taping, which are capable of reducing the risk of damaging the wafer.

As known in the art, wafer thinning plays an important role in the field of semiconductor packaging. Typically, the thickness of a wafer is reduced from about 750 micrometers to about 200 micrometers, or even thinner to about 30 to 40 micrometers. To protect the wafer surface, a protective film or a carrier film, which is also known as a blue tape, is adhered to the front surface of the wafer prior to the wafer thinning process. After the wafer thinning is completed, a dicing film is typically adhered to the backside of the wafer.

In some circumstances, semiconductor wafers having a stair-shaped wafer edge or step configuration are used in the fabrication of semiconductor integrated circuit chips. However, such wafer with step configuration along its perimeter may be problematic during wafer taping process.

SUMMARY

One aspect of the present disclosure provides a method for taping a wafer. A wafer taping device comprising a wafer stage is provided. A wafer is mounted on the wafer stage. A tape is delivered along a first direction over the wafer. The tape is forced into adhesion with a surface of the wafer in a non-contact manner. The tape is cut along a perimeter of the wafer.

According to some embodiments, the wafer is secured on the wafer stage by vacuum sucking means or electrostatic force.

According to some embodiments, the step of forcing the tape into adhesion with a surface of the wafer in a non-contact manner comprises: disposing an air blade with a slot-shaped air outlet in the wafer taping device, wherein the air blade provides an air flow with adequate and stable air pressure to force the tape into adhesion with the surface of the wafer.

According to some embodiments, a long axis of the air blade extends along a second direction, wherein the second direction is perpendicular to the first direction.

According to some embodiments, the air blade is in a normal position that provides the air flow that is generally vertical to the surface of the wafer.

According to some embodiments, the air blade is rotated and positioned at a specific angle with respect to the surface of the wafer.

According to some embodiments, a temperature of the air flow provided by the air blade is adjustable.

According to some embodiments, a temperature of the air flow ranges between about 0° C. and about 100° C.

According to some embodiments, a pressure of the air flow provided by the air blade is adjustable.

According to some embodiments, the pressure of the air flow ranges between about 0 kPa and about 500 kPa.

According to some embodiments, the wafer has a step structure on a front surface of the wafer.

According to some embodiments, the wafer comprises a peripheral zone and a center zone, and wherein the step structure is disposed within the peripheral zone.

According to some embodiments, the step structure is disposed around a bevel edge of the wafer and along the perimeter of the wafer.

According to some embodiments, the air flow has a first temperature and a first pressure in the peripheral zone, and has a second temperature and a second pressure in the center zone According to some embodiments, the first temperature is equal to or greater than the second temperature, and the first pressure is greater than the second pressure.

According to some embodiments, the first temperature is equal to or greater than the second temperature, and the first pressure is smaller than the second pressure.

Another aspect of the disclosure provides a device for wafer taping including: a wafer stage; a wafer mounted on the wafer stage; a tape delivering along a first direction above the wafer stage and the wafer; an air blade disposed above the wafer stage and the wafer, wherein the air blade provides an air flow with adequate and stable air pressure to force the tape into adhesion with a surface of the wafer; and a cutting device for cutting the tape along a perimeter of the wafer.

According to some embodiments, the device for wafer taping further comprises: a tape feeder used to feed the tape to be adhered to the surface of the wafer; a guiding roller used to adjust an angle between the tape and the surface of the wafer; and a winding roller used to wind a release of the tape drawn out from the tape feeder.

According to some embodiments, the wafer stage comprises a heating means for heating the wafer.

According to some embodiments, a temperature of the air flow provided by the air blade is adjustable in a range between about 0° C. and about 100° C.

These and other objectives of the present disclosure will no doubt become obvious to those of ordinary skill in the art after reading the following detailed description of the preferred embodiment that is illustrated in the various figures and drawings.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
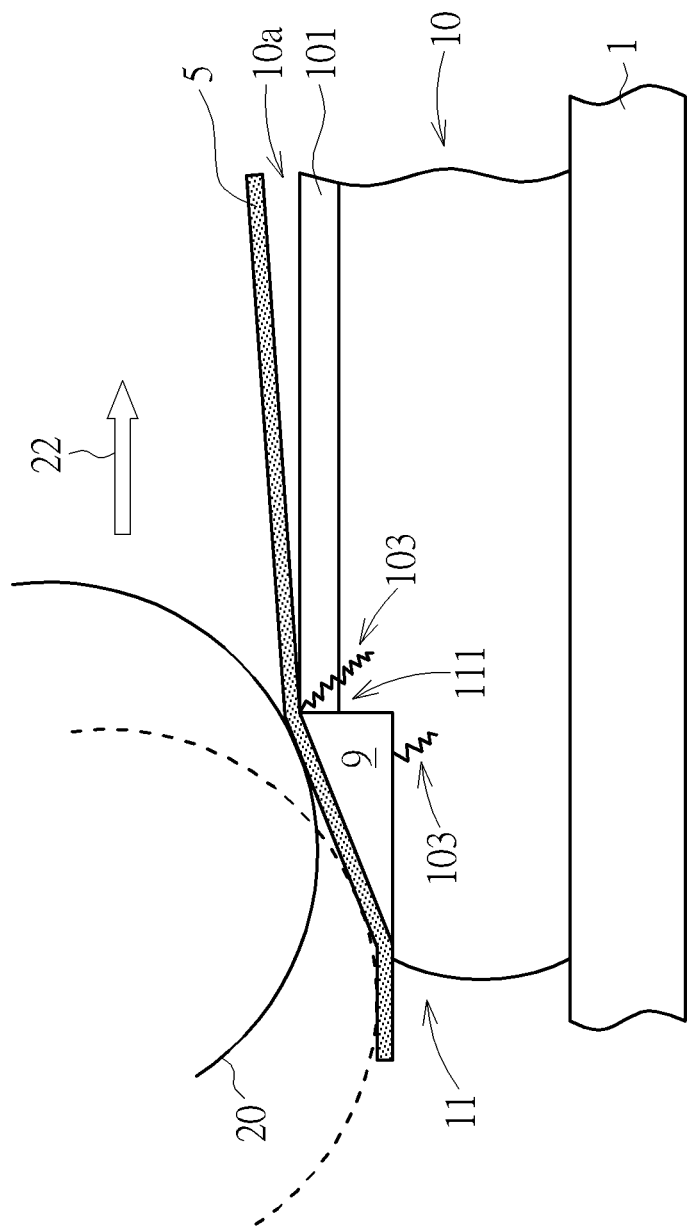
FIG. 1 is a schematic, enlarged diagram showing a wafer having a step configuration during wafer frontside taping process according to the disclosed method.

Embodiments of the present disclosure will be described with reference to the accompanying drawings.

DETAILED DESCRIPTION

Reference will now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It is noted that references in the specification to "one embodiment," "an embodiment," "an exemplary embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment.

Further, when a particular feature, structure or characteristic is described in contact with an embodiment, it would be within the knowledge of a person skilled in the pertinent art to affect such feature, structure or characteristic in contact with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures.

The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "wafer" generally refers to semiconductor substrates and semiconductor circuits built onto such substrate. Accordingly, as used herein, the term "wafer" generally applies to samples of semiconductor substrates and fabrications. It is considered that wafers are generally formed of a plurality of layers, such as thin films, using techniques as are known in the art.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

The present disclosure pertains to a non-contact method and a device for wafer taping, which are capable of avoiding damage to the wafer during the wafer taping process. The present disclosure is particularly suited for taping wafers having a stair-shaped wafer edge or step configuration. The tape can be fittingly adhered to the front surface and/or the rear surface of the wafer without exerting undesirable stress on the wafer. The wafers with such step configuration may be used in the fabrication of semiconductor integrated circuit chips.

It is advantageous to use the present disclosure because the tape can be fittingly adhered to the step structure along the perimeter of the wafer without forming significant void around the step structure, thereby providing adequate protection and support to the wafer surface.

FIG. 1 is a schematic, enlarged diagram showing a wafer having a step configuration during wafer frontside taping process according to the disclosed method. As shown in FIG. 1, the wafer 10 may be disposed and secured on a stage or a platform 1 of a wafer taping apparatus. The wafer 10 has a front surface 10a on which a plurality of semiconductor circuit elements are formed so as to form an active layer 101 on the front surface 10a of the wafer 10. A blue tape 5 is adhered to the front surface 10a by pressing a roller 20 against the front surface 10a of the wafer 10. The roller 20 moves and rolls along the predetermined direction 22 starting from the wafer bevel edge 11.

However, the roller 20 used during the wafer taping process may cause damage 103 to the wafer bevel edge 11 or the sharp corner 111 at bevel edge 11 of the wafer 10, which may lead to cracking of the wafer 10 during the subsequent wafer thinning process. Besides, because the diameter of the roller 20 is relatively large when compared to the step height of the step structure, the blue tape 5 cannot conformally cover the surface around the step structure, thereby forming a void 9 between the blue tape 5 and the wafer 10. Therefore, the blue tape 5 does not provide adequate support and protection to the wafer bevel edge 11 due to the formation of the void 9.

Figure 2:
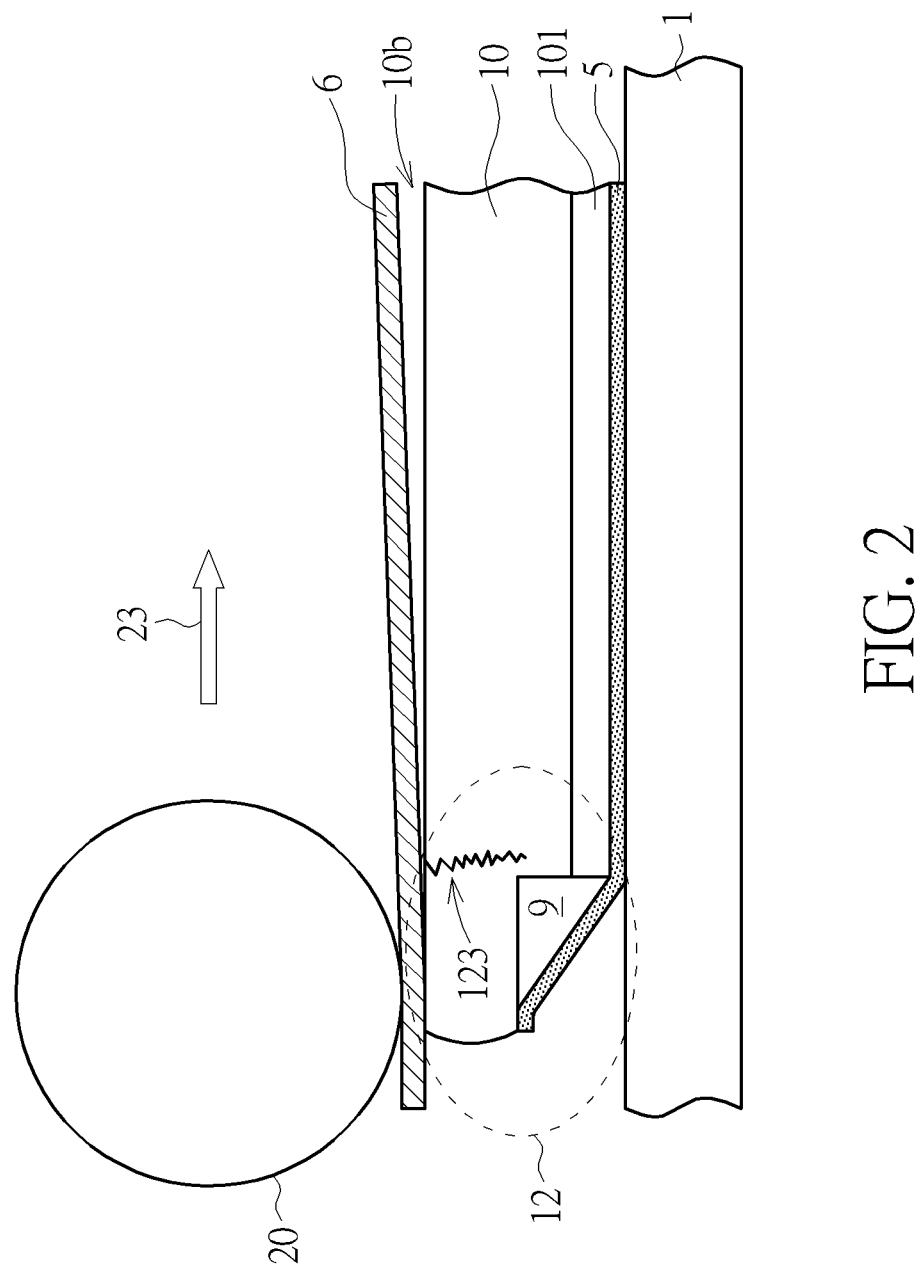
FIG. 2 is a schematic, enlarged diagram showing a wafer having a step configuration during wafer backside taping process performed after wafer thinning process according to the disclosed method.

FIG. 2 is a schematic, enlarged diagram showing a wafer having a step configuration during wafer backside taping process performed after wafer thinning process according to the disclosed method. As shown in FIG. 2, after the wafer thinning process, the thickness of the wafer 10 may be reduced to about several hundreds of micrometers or about 40 micrometers. A dicing tape 6 is adhered to the rear surface 10b of the wafer 10 by the roller 20 that moves along the predetermined direction 23. However, the roller 20 may induce stress to the high-risk zone 12 and may cause severe cracking 123 of the wafer 10.

Figure 3:
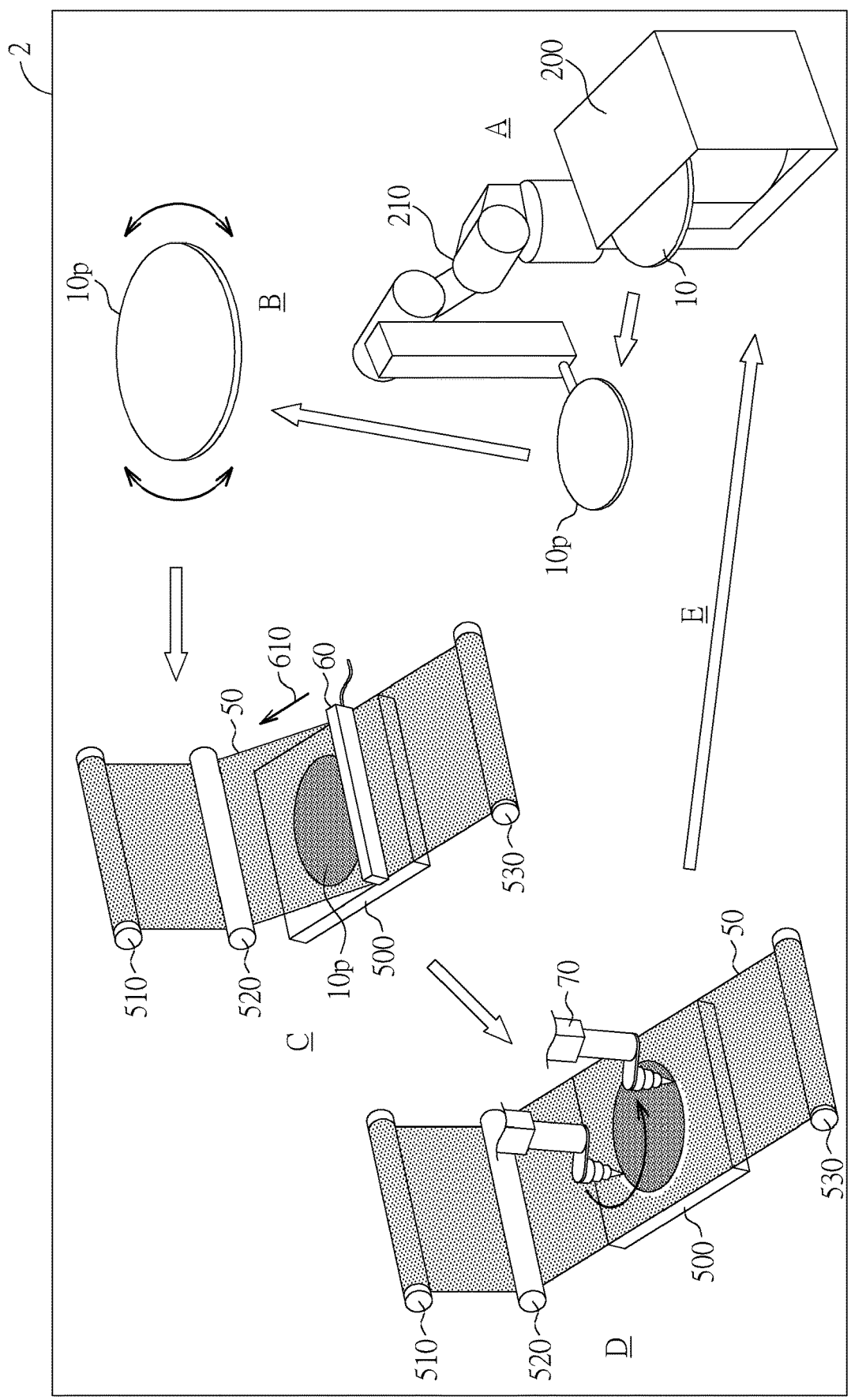
FIG. 3 is a schematic diagram showing the working steps for taping a wafer in a wafer taping device according to an exemplary embodiment of the disclosure.

Please refer to FIG. 3. FIG. 3 is a schematic diagram showing the working steps for taping a wafer in a wafer taping device 2 according to an exemplary embodiment of the disclosure. It is to be understood that the working steps shown in FIG. 3 are for illustration purposes only. In some embodiments of the disclosure, other devices or systems for wafer taping may be applicable.

As shown in FIG. 3, in Step A, wafers 10 may be stored in a cassette 200 or a quartz wafer boat and may be loaded into the wafer taping device 2. Within the wafer taping device 2, a wafer 10p to be processed may be moved and delivered by a robot arm 210. In Step B, the wafer 10p is positioned and aligned before loading onto a wafer stage. In Step C, the wafer 10p is mounted on the wafer stage 500. The wafer 10p may be secured on the upper surface of the wafer stage 500 by vacuum sucking means or electrostatic force, but is not limited thereto. A tape feeder 510 may be used to feed the tape 50 to be adhered to the wafer surface. A guiding roller 520 may be used to adjust the angle between the tape 50 and the wafer surface. A winding roller 530 may be used to wind a release of the tape 50 drawn out from the tape feeder 510. At least one air blade 60 (or air knife) is disposed above the wafer stage 500 and the wafer 10p. The air blade 60 may move along a first direction 610. The air blade 60 may be an air gun with long narrow nozzle or air outlet. According to one embodiment, a longitudinal length of the elongated air blade 60 may be equal to or greater than a diameter of the wafer 10p. The long axis of the elongated air blade 60 may extend along a second direction. For example, the second direction is perpendicular to the first direction 610, but not limited thereto. According to one embodiment, the air blade 60 may have a slot-shaped air outlet that can provide laminate air flow with adequate and stable air pressure to force the tape 50 into adhesion with the wafer surface in a non-contact manner. According to one embodiment, the temperature of the air flow provided by the air blade 60 is adjustable, for example, in a range between about 0° C. and about 100° C., but not limited thereto. According to one embodiment, the pressure of the air flow provided by the air blade 60 is adjustable, for example, in a range between about 0 kPa and about 500 kPa, but is not limited thereto. In Step D, the tape 50 is cut along the perimeter of the wafer 10p using a cutting device 70 such as a laser or a blade, but not limited thereto. In Step E, the wafer 10p is transferred back to the cassette 200. Subsequently, another wafer may be delivered by the robot arm, and Step A to Step E may be repeated to tape the delivered wafer.

Figure 4:
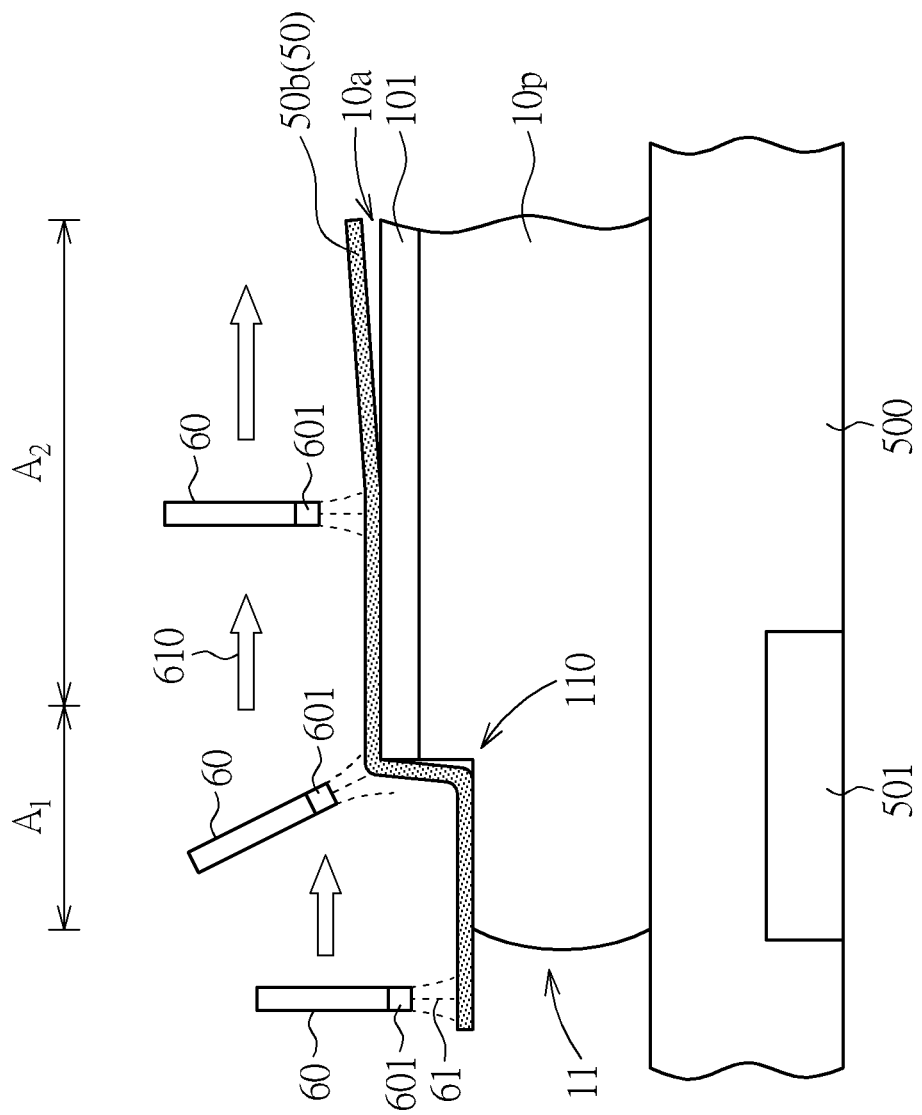
FIG. 4 is a schematic, enlarged diagram showing a wafer having a step configuration during wafer frontside taping process according to one embodiment of the disclosure.

FIG. 4 is a schematic, enlarged diagram showing a wafer having a step configuration during wafer frontside taping process according to one embodiment of the disclosure, wherein like regions, elements, structures, or layers are designated by like numeral numbers. As shown in FIG. 4, the wafer 10p may be disposed and secured on a wafer stage 500 of the wafer taping device 2 as set forth in FIG. 3. The wafer 10p may be secured on the upper surface of the wafer stage 500 by vacuum sucking means or electrostatic force, but is not limited thereto. According to one embodiment, the wafer stage 500 may comprise a heating means 501 for heating the wafer 10p.

The wafer 10p has a front surface 10a on which a plurality of semiconductor circuit elements such as transistors, capacitors, interconnects, or the like are formed so as to form an active layer 101 on the front surface 10a of the wafer 10p. The wafer 10p may be a semiconductor wafer or substrate comprising a silicon substrate, a SiGe substrate, an epitaxial substrate, or a silicon-on-insulator (SOI) substrate, but is not limited thereto. In some embodiments, the wafer 10p may have a diameter greater than about 100 mm. In some embodiments, the wafer 10p may have a diameter equal to or greater than about 300 mm. In some embodiments, the wafer 10p may have a diameter equal to or greater than about 450 mm.

According to one embodiment, the wafer 10p has a step structure 110 on the front surface 10a of the wafer 10p. According to one embodiment, the step structure 110 is disposed around the wafer bevel edge 11 and along the perimeter of the wafer 10p. According to one embodiment, the wafer 10p may comprise at least two zones including a peripheral zone $A_1$ and a center zone $A_2$. The step structure 110 is disposed within the peripheral zone $A_1$.

According to one embodiment, a blue tape 50b is adhered to the front surface 10a by the air blade 60. The air blade 60 moves along the first direction 610 starting from the wafer bevel edge 11. The air blade 60 may be in a normal position that provides air flow 61 that is generally vertical to the front surface 10a of the wafer 10p, or the air blade 60 may be rotated if necessary. For example, as indicated in FIG. 4, the air blade 60 is rotated and positioned at a specific angle with respect to the front surface 10a of the wafer 10p in order to deal with the step structure 110 such that the blue tape 50b is fittingly adhered to the surface around the corners of the step structure 110 and no significant void is formed between the blue tape 50b and the wafer 10p. By providing such rotatable air blade 60, the direction of the air flow 61 can be adjusted corresponding to the topograph of the wafer surface so that the yield of the wafer taping process is improved.

Therefore, it is advantageous to use the present disclosure because the tape can be fittingly adhered to the step structure along the perimeter of the wafer without forming significant void around the step structure, thereby providing adequate protection and support to the wafer surface. The yield and throughput of the wafer taping process are improved.

According to one embodiment, the air flow 61 provided by the air blade 60 may be hot air or cold air. For example, the temperature of the air flow 61 may range between about 0° C. and about 100° C., but is not limited thereto. A temperature sensor 601 may be disposed at the air outlet of the air blade 60 to detect the temperature of the air flow 61. The pressure and temperature of the air flow 61 may be optimized and determined according to the type of the tape and the thickness of the wafer.

According to one embodiment, the air flow 61 has a first temperature $T_1$ and a first pressure $P_1$ in the peripheral zone $A_1$, and has a second temperature $T_2$ and a second pressure $P_2$ in the center zone $A_2$. According to one embodiment, during the wafer taping of the front surface 10a of the wafer 10p, the first temperature $T_1$ may be equal to or greater than the second temperature $T_2$ and the first pressure $P_1$ may be greater than the second pressure $P_2$. For example, in the peripheral zone $A_1$, the first temperature $T_1$ may be about 50~60° C. and the first pressure $P_1$ may be about 150~300 kPa, while in the center zone $A_2$, the second temperature $T_2$ may be about 40~50° C. and the second pressure $P_2$ may be about 100~150 kPa.

According to one embodiment, the flow rate, the temperature, and the pressure of the air flow 61 may be controlled by a computer (not shown) and may be adjusted in real time during the wafer taping process. The heat provided by the air flow 61 and the wafer stage 500 can improve the bonding of the tape 50 to the wafer surface. The heat provided by the air flow 61 can make the tape softer such that the tape can fit with the wafer surface better and provide better support and protection to the wafer.

Figure 5:
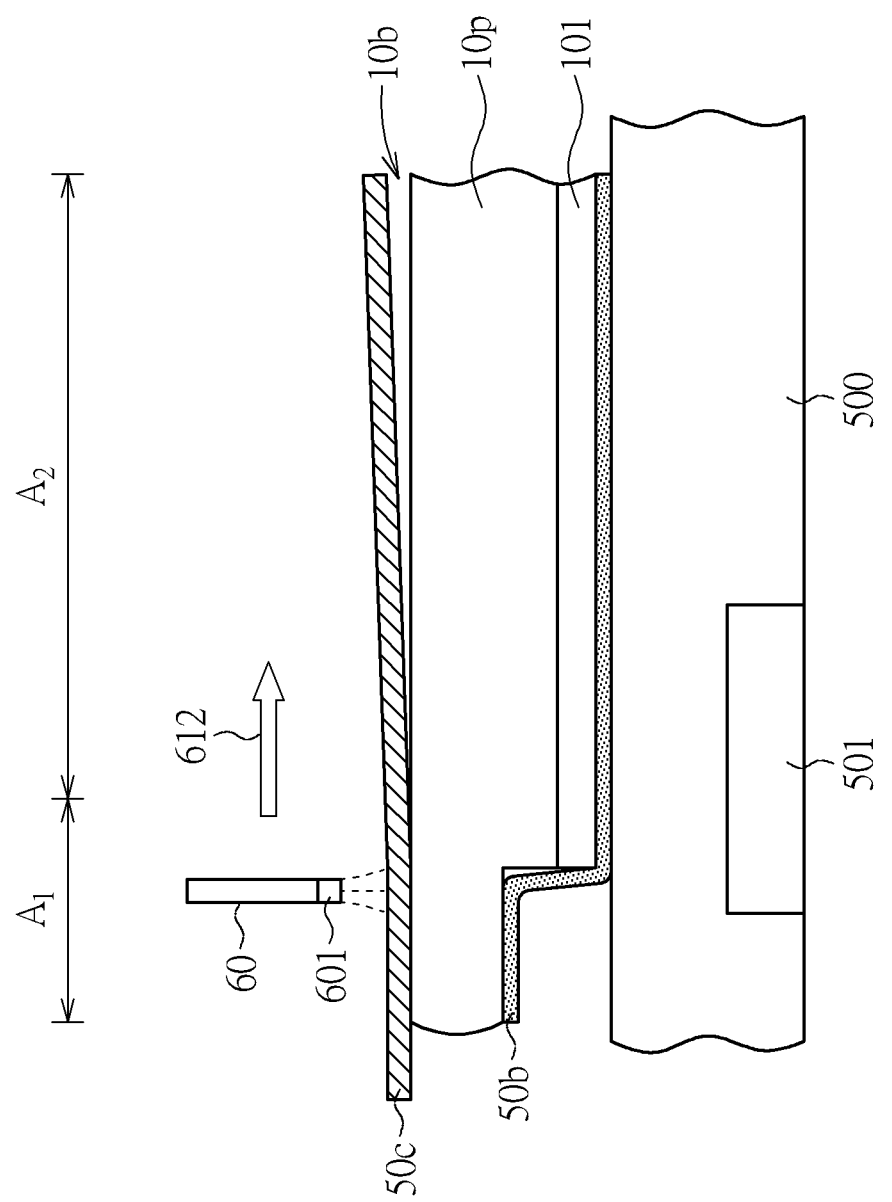
FIG. 5 is a schematic, enlarged diagram showing a wafer having a step configuration during wafer backside taping process performed after wafer thinning process according to one embodiment of the disclosure.

FIG. 5 is a schematic, enlarged diagram showing a wafer having a step configuration during wafer backside taping process performed after wafer thinning process according to one embodiment of the disclosure. As shown in FIG. 5, after the wafer thinning process, the thickness of the wafer 10*p* may be reduced to about several hundreds of micrometers or about 40 micrometers. A dicing tape 50*c* is adhered to the rear surface 10*b* of the wafer 10 by the air blade 60 that moves along the predetermined direction 612.

According to one embodiment, during the wafer taping of the rear surface 10*b* of the wafer 10*p*, the first temperature $T_1$ may be equal to or greater than the second temperature $T_2$ and the first pressure $P_1$ may be smaller than the second pressure $P_2$. For example, in the peripheral zone $A_1$, the first temperature $T_1$ may be about 50~60° C. and the first pressure $P_1$ may be about 100~150 kPa, while in the center zone $A_2$, the second temperature $T_2$ may be about 40~50° C. and the second pressure $P_2$ may be about 150~300 kPa. The smaller pressure at the peripheral zone A1 can reduce the risk of damaging the wafer edge of the thinned wafer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for taping a wafer, comprising:
   providing a wafer taping device comprising a wafer stage;
   mounting a wafer on the wafer stage;
   delivering a tape along a first direction over the wafer;
   forcing the tape into adhesion with a surface of the wafer in a non-contact manner, wherein said forcing the tape into adhesion with a surface of the wafer in a non-contact manner comprises disposing an air blade with a slot-shaped air outlet in the wafer taping device, wherein the air blade provides an air flow with adequate and stable air pressure to force the tape into adhesion with the surface of the wafer, wherein the air blade is rotated and positioned at a specific angle with respect to the surface of the wafer; and
   cutting the tape along a perimeter of the wafer.

2. The method for taping a wafer according to claim 1, wherein the wafer is secured on the wafer stage by vacuum sucking means or electrostatic force.

3. The method for taping a wafer according to claim 1, wherein the air blade has a long axis extending along a second direction, wherein the second direction is perpendicular to the first direction.

4. The method for taping a wafer according to claim 1, wherein the air blade is in a normal position that provides the air flow that is vertical to the surface of the wafer.

5. The method for taping a wafer according to claim 1, wherein a temperature of the air flow provided by the air blade is adjustable.

6. The method for taping a wafer according to claim 5, wherein a temperature of the air flow ranges between about 0° C. and about 100° C.

7. The method for taping a wafer according to claim 1, wherein a pressure of the air flow provided by the air blade is adjustable.

8. The method for taping a wafer according to claim 7, wherein the pressure of the air flow ranges between about 0 kPa and about 500 kPa.

9. The method for taping a wafer according to claim 1, wherein the wafer has a step structure on a front surface of the wafer.

10. The method for taping a wafer according to claim 9, wherein the wafer comprises a peripheral zone and a center zone, and wherein the step structure is disposed within the peripheral zone.

11. The method for taping a wafer according to claim 10, wherein the air flow has a first temperature and a first pressure in the peripheral zone, and has a second temperature and a second pressure in the center zone.

12. The method for taping a wafer according to claim 11, wherein the first temperature is equal to or greater than the second temperature and the first pressure is greater than the second pressure.

13. The method for taping a wafer according to claim 11, wherein the first temperature is equal to or greater than the second temperature and the first pressure is smaller than the second pressure.

14. The method for taping a wafer according to claim 9, wherein the step structure is disposed around a bevel edge of the wafer and along the perimeter of the wafer.

15. The method for taping a wafer according to claim 1, further comprising:
   adjusting a direction of the air flow by rotating the air blade according to a topograph of the wafer surface when the air blade moves across the wafer stage.

* * * * *